US009287483B2

(12) United States Patent
Lee et al.

(10) Patent No.: US 9,287,483 B2
(45) Date of Patent: Mar. 15, 2016

(54) THERMOELECTRIC MATERIAL WITH IMPROVED IN FIGURE OF MERIT AND METHOD OF PRODUCING SAME

(71) Applicants: SAMSUNG ELECTRONICS CO., LTD., Suwon-si, Gyeonggi-do (KR); INDUSTRY-ACADEMIC COOPERATION FOUNDATION, YONSEI UNIVERSITY, Seoul (KR)

(72) Inventors: Kyu-Hyoung Lee, Hwaseong-si (KR); Jong-Wook Roh, Yongin-si (KR); Dae-Jin Yang, Yeongju-si (KR); Un-Lyong Jeong, Seoul (KR)

(73) Assignees: SAMSUNG ELECTRONICS CO., LTD. (KR); INDUSTRY-ACADEMIC COOPERATION FOUNDATION, YONSEI UNIVERSITY (KR)

( * ) Notice: Subject to any disclaimer, the term of this patent is extended or adjusted under 35 U.S.C. 154(b) by 381 days.

(21) Appl. No.: 13/665,600

(22) Filed: Oct. 31, 2012

(65) Prior Publication Data

US 2013/0284987 A1    Oct. 31, 2013

(30) Foreign Application Priority Data

Apr. 27, 2012    (KR) .................. 10-2012-0044846

(51) Int. Cl.
| | | |
|---|---|---|
| *H01B 1/02* | (2006.01) | |
| *H01L 35/16* | (2006.01) | |
| *B82Y 30/00* | (2011.01) | |
| *H01L 35/34* | (2006.01) | |

(52) U.S. Cl.
CPC ............. *H01L 35/16* (2013.01); *B82Y 30/00* (2013.01); *H01L 35/34* (2013.01)

(58) Field of Classification Search
CPC ......... H01L 35/16; H01L 35/22; H01L 35/26; H01L 35/34; C01B 19/04; B82Y 30/00; H01B 1/06
USPC ............ 252/514; 136/200, 203, 238; 428/369
See application file for complete search history.

(56) References Cited

U.S. PATENT DOCUMENTS

| | | | |
|---|---|---|---|
| 7,365,265 B2 | 4/2008 | Heremans et al. | |
| 7,586,033 B2 | 9/2009 | Ren et al. | |
| 8,044,292 B2 | 10/2011 | Xiao et al. | |
| 2008/0202575 A1 | 8/2008 | Ren et al. | |
| 2010/0175734 A1* | 7/2010 | Lee et al. ...................... | 136/238 |
| 2012/0018682 A1* | 1/2012 | Minami et al. ................ | 252/514 |
| 2013/0040138 A1* | 2/2013 | Wu et al. ........................ | 428/369 |

FOREIGN PATENT DOCUMENTS

| | | |
|---|---|---|
| KR | 1020110052225 A | 5/2011 |
| WO | 2011059185 A2 | 5/2011 |

OTHER PUBLICATIONS

Hsu, Kuei Fang, et al., "Cubic AgPbmSbTe2+m: Bulk Thermoelectric Materials with High Figure of Merit," Reports, Science, vol. 303, Feb. 6, 2004, pp. 818-821.

(Continued)

*Primary Examiner* — Khanh Tuan Nguyen
(74) *Attorney, Agent, or Firm* — Cantor Colburn LLP

(57) ABSTRACT

A nanocomposite including: a thermoelectric material nanoplatelet; and a metal nanoparticle disposed on the thermoelectric material nanoplatelet.

9 Claims, 14 Drawing Sheets

(56) References Cited

OTHER PUBLICATIONS

Mehta, Rutvik J., et al., "A new class of doped nanobulk high-figure-of-merit thermoelectrics by scalable bottom-up assembly," Articles, Nature Materials, vol. 11, Mar. 2012, pp. 233-240.

Poudel, Bed, et al., "High-Thermoelectric Performance of Nanostructured Bismuth Antimony Telluride Bulk Alloys," Research Articles, Science, vol. 320, May 2, 2008, pp. 634-638.

Rhyee, Jong-Soo, et al., "Peierls distortion as a route to high thermoelectric performance in In4Se3- crystals," Letters, Nature, vol. 459, Jun. 18, 2009, pp. 965-968.

Sales, B. C., et al., "Filled Skutterudite Antimonides: A New Class of Thermoelectric Materials," Science, New Series, vol. 272, No. 5266, May 31, 1996, pp. 1325-1328.

Snyder, G. Jeffrey, et al., "Disordered zinc in Zn4Sb3 with phonon-glass and electron-crystal thermoelectric properties," Articles, Nature Materials, vol. 3, Jul. 2004, pp. 458-463.

Son, Jae Sung, et al., "n-Type Nanostructured Thermoelectric Materials Prepared from Chemically Synthesized Ultrathin Bi2Te3 Nanoplates," Letter, Nano Letters, vol. 12, Jan. 23, 2012, pp. 640-647.

Soni, Ajay, et al., "Enhanced Thermoelectric Properties of Solution Grown Bi2Te3-xSex Nanoplatelet Composites," Letter, Nano Letters, vol. 12, Feb. 1, 2012, pp. 1203-1209.

Venkatasubramanian. Rama, et al., "Thin-film thermoelectric devices with high room-temperature figures of merit," Articles, Nature, vol. 413, Oct. 11, 2001, pp. 597-602.

* cited by examiner

US 9,287,483 B2

THERMOELECTRIC MATERIAL WITH IMPROVED IN FIGURE OF MERIT AND METHOD OF PRODUCING SAME

This application claims priority to and the benefit of Korean Patent Application No. 10-2012-0044846, filed on Apr. 27, 2012, and all the benefits therefrom under 35 U.S.C. §119, the content of which in its entirety is herein incorporated by reference.

BACKGROUND

1. Field

A highly efficient thermoelectric material with an improved figure of merit and method of producing the same is disclosed.

2. Description of the Related Art

The thermoelectric effect is a reversible and direct energy conversion between heat and electricity, which is generated by transfer of electrons and holes in the material.

The thermoelectric effect may be divided into a Peltier effect and a Seebeck effect, wherein the Peltier effect provides cooling using a temperature difference between ends of a thermoelectric material and is generated by an applied current, and the Seebeck effect provides power generated using an electromotive force generated by a temperature difference between ends of a thermoelectric material.

Currently, thermoelectric materials are applied to active cooling systems of semiconductor equipment and electronic devices in which suitable thermal management is difficult to provide by a passive cooling system. The demand for thermoelectric cooling is expanding into other cooling applications, such as precision temperature control for DNA synthesis, and the like, where providing suitable thermal control is difficult using a coolant gas compression system.

Thermoelectric cooling is a vibration-free, low-noise, and eco-friendly cooling technology that does not use a coolant gas that can cause environmental problems. Thus, if a high efficiency thermoelectric cooling material is developed which provides improved cooling efficiency, the application of thermoelectrics may be expanded into general purpose cooling such as refrigeration, air conditioning, and the like.

Furthermore, if a thermoelectric material is applied to a location where heat is released, such as a heat-emitting part in a car engine, or an industrial factory, electricity may be generated. The technology is highlighted as a new renewable energy source.

Thermoelectric electricity generation is being already operated in space probes of Mars and Saturn, where solar energy is not available.

Nonetheless, there remains a need for an improved thermoelectric material.

SUMMARY

An embodiment provides a nanocomposite-type thermoelectric material with an improved figure of merit.

Another embodiment provides a method of producing the nanocomposite-type thermoelectric material.

According to an embodiment, disclosed is a nanocomposite including: a thermoelectric material nanoplatelet; and a metal nanoparticle disposed on the thermoelectric material nanoplatelet.

The metal nanoparticle may be disposed on a surface of the thermoelectric material nanoplatelet.

The thermoelectric material nanoplatelet may be an alloy-type thermoelectric material, particularly an alloy-type thermoelectric material having a chemical formula of $A_2M_3$.

In the chemical formula of $A_2M_3$, A may be Bi, and M may be selected from Te, Se, and a combination thereof.

The metal nanoparticle may include a metal selected from Group 4 to Group 14, an alloy thereof, and a combination thereof.

According to another embodiment, disclosed is a method of producing the nanocomposite disclosed above, the method including providing a solution including a thermoelectric material nanoplatelet precursor; heating the solution; contacting the heated solution with a reducing agent; and contacting a product of the heated solution with a precursor for forming a metal nanoparticle to produce the nanocomposite.

According to yet another embodiment, a bulk thermoelectric material including the nanocomposite disclosed above is provided.

According to still another embodiment, a method of producing the thermoelectric material is provided, the method including: introducing the nanocomposite disclosed above into a mold; and pressure sintering the nanocomposite to prepare the thermoelectric material.

BRIEF DESCRIPTION OF THE DRAWINGS

The above and other aspects, advantages and features of this disclosure will become more apparent by describing in further detail exemplary embodiments thereof with reference to the accompanying drawings, in which:

FIGS. 1A to 1D show the results of transmission electron microscopy (TEM) analysis of a $Bi_2Te_3$ nanoplatelet prepared in Example 1 in which FIGS. 1A and 1C are bright field images and FIG. 1D is a selected area diffraction image, and FIG. 1B is an enlarged view of region A in FIG. 1A, and FIG. 1C is an enlarged view of region B in FIG. 1B;

DETAILED DESCRIPTION

Figure 1A:
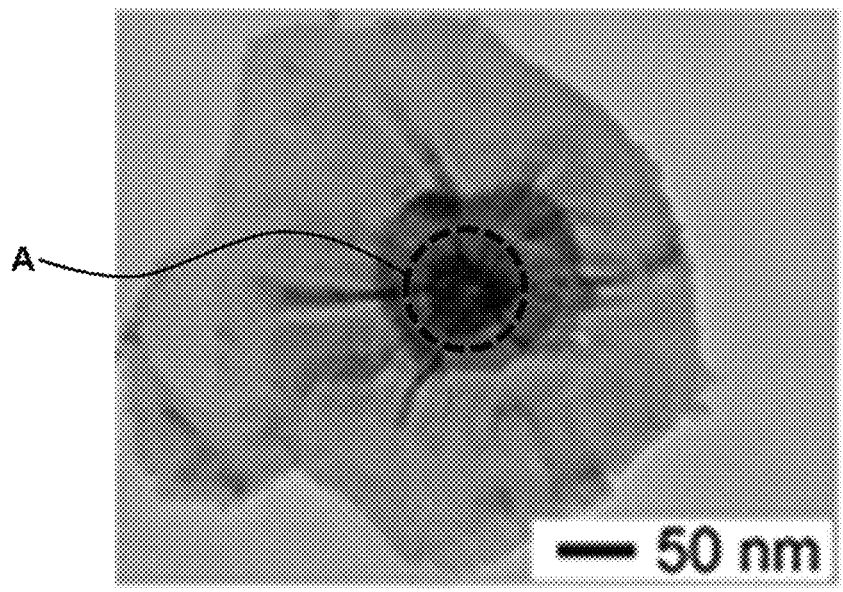

Exemplary embodiments will hereinafter be described in further detail. This disclosure may, however, be embodied in many different forms and should not be construed as limited to the exemplary embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present general inventive concept.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "a combination thereof" refers to a combination comprising at least one of the named constituents, components, compounds, or elements, optionally together with one or more like constituents, components, compounds, or elements not named.

For convenience, the term "mixture" is used to refer to any combination of two different materials irrespective of the form, and thus includes solutions, dispersions, emulsions, alloys, physical mixtures, and the like.

An alloy is a metal comprising a combination of elements.

A polyol is an organic compound having two or more hydroxyl groups.

"Group" refers to a Group of the Periodic Table of the Elements.

An embodiment provides a nanocomposite including a thermoelectric material nanoplatelet; and a metal nanoparticle disposed on the thermoelectric material nanoplatelet.

Specifically, the metal nanoparticle may be disposed on a surface of the thermoelectric material nanoplatelet.

Performance of the thermoelectric material may be represented by a ZT value commonly called a dimensionless figure of merit, as defined in the following Equation 1.

$$ZT = \frac{S^2 \sigma T}{k} \qquad \text{Equation 1}$$

In Equation 1, Z is a figure of merit, S is a Seebeck coefficient, $\sigma$ is electrical conductivity, T is absolute temperature, and K is thermal conductivity.

As shown in Equation 1, to increase the ZT value of the thermoelectric material, the Seebeck coefficient and electrical conductivity, namely, a power factor ($S^2\sigma$), should be increased, and thermal conductivity should be decreased.

However, according to Equation 1 the Seebeck coefficient and electrical conductivity have a trade-off relationship such that if one value increases, as can be provided by a change in the concentration of carrier electrons or holes, the other value decreases, and thus Equation 1 suggests that there is a limitation in increasing the power factor.

In late 1990s, rapid progress in nano-technology enabled the manufacture of superlattice thin films, nanowires, quantum dots, and the like. These materials are characterized by a high figure of merit provided by breaking the trade-off relationship between electrical conductivity and Seebeck coefficient using the quantum confinement effect, or by the phonon glass electron crystal ("PGEC") method that provides for a decrease in thermal conductivity while maintaining the power factor.

A strategy for decreasing thermal conductivity is to provide a microstructure that effectively scatters phonons, which are responsible for heat transfer, by providing a suitable nanostructure.

A grain boundary is an effective interface for scattering phonons, and if the particle size is decreased to increase the density of the grain boundaries, lattice thermal conductivity may be decreased.

As a strategy to provide such a material, nano-manufacturing technology to provide a nano-sized particle of a thermoelectric material, such as a nanoparticle, nanowire, nanoplatelet, and the like, has recently been advanced.

Particularly, a nanoplatelet may be produced in bulk, and since it may be manufactured with a size of several nanometers, the larger grain boundary density may be provided as compared to larger nanoparticles.

Accordingly, in the nanocomposite, according to an embodiment, a metal nanoparticle may be bonded to the nanoplatelet-type thermoelectric particulate material surface while maintaining an increased density of the nanoparticle during the bulk production. As a result, phonons are scattered by the high density grain boundaries of the nanoplatelet, thus decreasing thermal conductivity of the material, and simultaneously increasing, e.g., doubling, the phonon scattering effect by the metal nanoparticle, thereby largely decreasing thermal conductivity.

Further, the Seebeck coefficient may be increased by carrier filtering by a conductive metal nanoparticle to maximize the figure of merit (ZT).

According to an embodiment, the thermoelectric material nanoplatelet may be an alloy of thermoelectric material, and particularly, an alloy of a thermoelectric material nanoplatelet of the chemical formula $A_2M_3$.

According to another embodiment, in chemical formula $A_2M_3$, A is Bi and M is an element selected from Te, Se, and a combination thereof.

Specifically, thermoelectric material nanoplatelets may be alloy of a thermoelectric material nanoplatelet represented by the chemical formula $Bi_2Te_3$, $Bi_2Se_3$, or $Bi_2Te_{3-x}Se_x$, wherein $0 \leq x \leq 3$, specifically $0 < x < 3$.

According to an embodiment, the metal nanoparticle may comprise a metal selected from Group 4 to Group 14, an alloy thereof, and a combination thereof, specifically a transition metal, more specifically a noble metal. An alloy of the foregoing may be used.

For example, the metal nanoparticle may comprise a metal selected from Pt, Pd, Au, Ag, Ti, V, Cr, Mn, Fe, Co, Ni, Cu, Zn, Ga, Ge, Mo, Cd, In, Sn, an alloy thereof, and a combination thereof. Pt, Pd, Au, and Ag are specifically mentioned.

The metal nanoparticle may be included in the thermoelectric material nanocomposite in an amount of about 0.1 to about 10 parts by weight, specifically about 0.5 to about 2 parts by weight, based on 100 parts by weight of the thermoelectric material nanoplatelet.

The metal nanoparticle may be included in the thermoelectric material nanocomposite in an amount of about 0.1 to about 10 weight percent (wt %), specifically about 0.5 to about 2 wt %, based on a total weight of the thermoelectric material nanoplatelet Alternatively, the metal nanoparticle may be included in the thermoelectric material nanocomposite in the amount of about 0.1 to about 10 weight percent (wt %), specifically about 0.5 to about 2 wt %, based on the total weight of the nanocomposite.

Within the above range, the prepared nanocomposite-type thermoelectric material may provide increased power factor and decreased lattice thermal conductivity.

The metal nanoparticle may have a particle diameter of less than or equal to about 50 nm, specifically less than or equal to about 20 nm, and more specifically less than or equal to about 10 nm, and may have a particle diameter of about 1 to about 50 nm, specifically about 2 to about 25 nm.

Another embodiment provides a method of producing the thermoelectric material nanocomposite.

According to an embodiment, the method of producing the thermoelectric material nanocomposite includes providing a solution including a thermoelectric material nanoplatelet precursor, heating the solution, contacting the heated solution with a reducing agent, and contacting a product of the heated solution with a precursor for forming the metal nanoparticle to produce the nanocomposite.

Specifically, to make the thermoelectric material nanoplatelet of chemical formula $Bi_2Te_{3-x}Se_x$ ($0 \leq x \leq 3$), the thermoelectric material nanoplatelet precursor may comprise a bismuth compound in addition to a compound selected from a tellurium compound, a selenium compound, and a combination thereof. The bismuth compound may be a compound selected from a bismuth halide, a bismuth nitrate, a bismuth hydroxide, a bismuth oxide, and a combination thereof. $BiCl_4$ and $Bi(NO_3)_3 \cdot 5H_2O$ are specifically mentioned. The tellurium compound and the selenium compound may be a compound selected from an oxide, a hydroxide, a halide, a nitrate, and a combination thereof. $Na_2TeO_3$, $Te(OH)_6$, $Na_2SeO_3$, and $Se(OH)_6$ are specifically mentioned, but the tellurium compound and the selenium compound are not limited thereto.

A solution including the thermoelectric material nanoplatelet precursor may be prepared by dissolving the thermoelectric material nanoplatelet precursor in a solvent. Examples of a suitable organic solvent includes an alcohol (e.g., methanol, ethanol, butanol); water; liquid carbon dioxide; an aldehyde (e.g., acetaldehydes, propionaldehydes), formamides (e.g., N,N-dimethylformamide); a ketone (e.g., acetone, methyl ethyl ketone, β-bromoethyl isopropyl ketone); acetonitrile; a sulfoxide (e.g., dimethylsulfoxide, diphenylsulfoxide, ethyl phenyl sulfoxide); a sulfone (e.g., diethyl sulfone, phenyl 7-quinolylsulfone); a thiophene (e.g., thiophene 1-oxide); an acetate (e.g., ethylene glycol diacetate, n-hexyl acetate, 2-ethylhexyl acetate); and an amide (e.g., propanamide, benzamide). A combination comprising at least one of the foregoing solvents can be used. Specifically the solvent may be a polyhydric alcohol, i.e., a polyol, for example, an alkylene glycol, more specifically ethylene glycol, but the solvent is not limited thereto.

According to an embodiment, the solution may further include a surfactant. Examples of a suitable surfactant include a non-ionic surfactant such as a polyether alcohol, such as a polymer of 4-(1,1,3,3-tetramethylbutyl)phenol with ethylene oxide and formaldehyde, a sorbitan derivative, e.g. a polyoxyethylene sorbitan fatty acid ester, a polyoxyethylene ether, a polyoxyethylene alkyl ethers, specifically pentaethyleneglycol mono n-dodecylether, a polyoxyethylene castor oil derivative, a polyvinylalcohol, a copolymers of a polyethyleneoxide, a polypropyleneoxide, a polybutyleneoxide, a polyethyleneglycol (PEG), and a combination thereof. A surfactant selected from polyvinyl pyrrolidone ("PVP"), polyethyleneimine ("PEI"), and a combination thereof, are specifically mentioned.

According to an embodiment, the surfactant may be dissolved in the same solvent which is used for dissolving the thermoelectric material nanoplatelet precursor of the thermoelectric material nanoplatelet, before they are included in the solution of the thermoelectric material nanoplatelet precursor. Also, the solution including the surfactant may be combined with the solution including the thermoelectric material nanoplatelet precursor to incorporate the surfactant in the solution including the thermoelectric material nanoplatelet precursor.

The solution including the thermoelectric material nanoplatelet precursor of the thermoelectric material nanoplatelet and the surfactant may be heated while agitating under an inert gas atmosphere, specifically, a nitrogen, argon, or helium gas atmosphere.

The heating may proceed to a temperature at which a reaction between the components of the thermoelectric material nanoplatelet precursor occurs. Specifically, if the thermoelectric material nanoplatelet precursor comprises $BiCl_4$ or $Bi(NO_3)_3 \cdot 5H_2O$ and $Na_2TeO_3$ or $Te(OH)_6$, or the thermoelectric material nanoplatelet precursor comprises $Na_2SeO_3$ or $Se(OH)_6$, the heating may proceed to a temperature of about 150 to about 250° C. to initiate the reaction. In an embodiment, the thermoelectric material nanoplatelet precursor is heated to about 100 to about 300° C., specifically about 150 to about 250° C.

Suitable reducing agents include, but are not limited to $H_2$, CO, $N_2H_4$, $NH_2OH$, an alcohol, a citrate such as a citrate selected from a sodium, potassium, and an ammonium citrate. As the reducing agent, $NH_2OH$ is specifically mentioned, but it is not limited thereto.

After introducing the reducing agent into the solution, a metal nanoparticle precursor for forming the metal nanoparticle may be introduced into the solution.

The metal nanoparticle precursor for forming the metal nanoparticle may be previously dissolved in the same solvent as the solvent used for dissolving the thermoelectric material nanoplatelet precursor used to make the thermoelectric material nanoplatelet, and then the solution of the metal nanoparticle precursor may be introduced into, e.g., contacted with, the solution including the reducing agent.

The metal nanoparticle precursor may comprise a metal selected from Pt, Pd, Au, Ag, Ti, V, Cr, Mn, Fe, Co, Ni, Cu, Zn, Ga, Ge, Mo, Cd, In, Sn, and a combination thereof. The metal nanoparticle precursor may be a compound selected from an oxide, a hydroxide, a nitrate, and a combination thereof. The metal nanoparticle precursor may be a salt, and may comprise a cation selected from Group 1, Group 2, or a combination thereof. As the metal nanoparticle precursor, for example, $NaPtCl_4$, $NaPdCl_4$, $NaAuCl_4$, $NaAuCl_2$, and $NaAgCl_2$ are specifically mentioned. A combination thereof may be used.

The metal nanoparticle precursor is not limited to the above materials.

Unless the metal nanoparticle precursor is not introduced after introducing the reducing agent, thermoelectric material nanoplatelets may precipitate from the corresponding solution.

However, as described above, if the metal nanoparticle precursor is introduced within a specific time after introducing the reducing agent, e.g., a time of about 1 minute to about 10 hours, specifically about 2 minutes to about 5 hours, more specifically about 4 minutes to about 2 hours, or about 8 minutes to about 1 hour, or about 16 minutes to about 30 minutes, a nanocomposite wherein the metal nanoparticle is bonded to the surface of the precipitated thermoelectric material nanoplatelet may be obtained from the corresponding solution.

According to an embodiment, the metal nanoparticle precursor may be introduced within about 1 hour after introducing the reducing agent.

If more than or equal to about 1 hour elapses without introducing the metal nanoparticle precursor, precipitation of the thermoelectric material nanoplatelet may be completed, and thus it may be more difficult to obtain a composite.

By introducing the reducing agent and the metal nanoparticle precursor, a thermoelectric material nanoplatelet of the chemical formula $Bi_2Te_3$, $Bi_2Se_3$, or $Bi_2Te_{3-x}Se_x$ wherein $0 \leq x \leq 3$, specifically $0 < x < 3$, with a nanometer thickness, is precipitated from the solution, and simultaneously a nanocomposite having a metal nanoparticle bonded to the surface of the nanoplatelet may be obtained.

According to an embodiment, the nanocomposite may be obtained by washing the precipitated nanoplatelet with a solution of water and acetone and centrifuging.

Figure 2A:
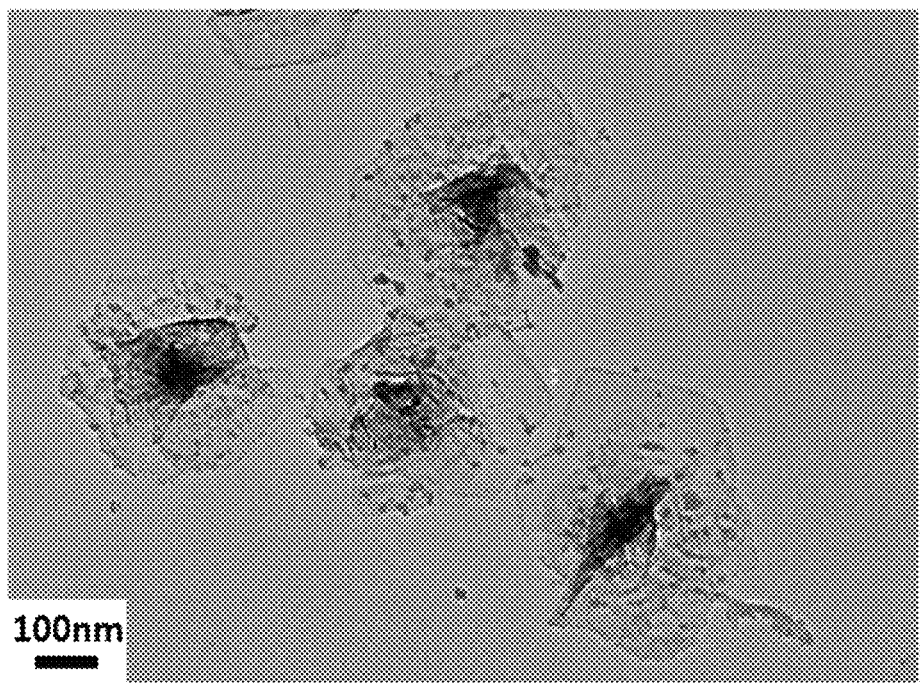
FIG. 2A shows a TEM image of a nanocomposite including a Pt nanoparticle bonded on the surface of a $Bi_2Te_3$ nanoplatelet and having a size of 5 to 10 nm as prepared in Example 1.
Figure 2B:
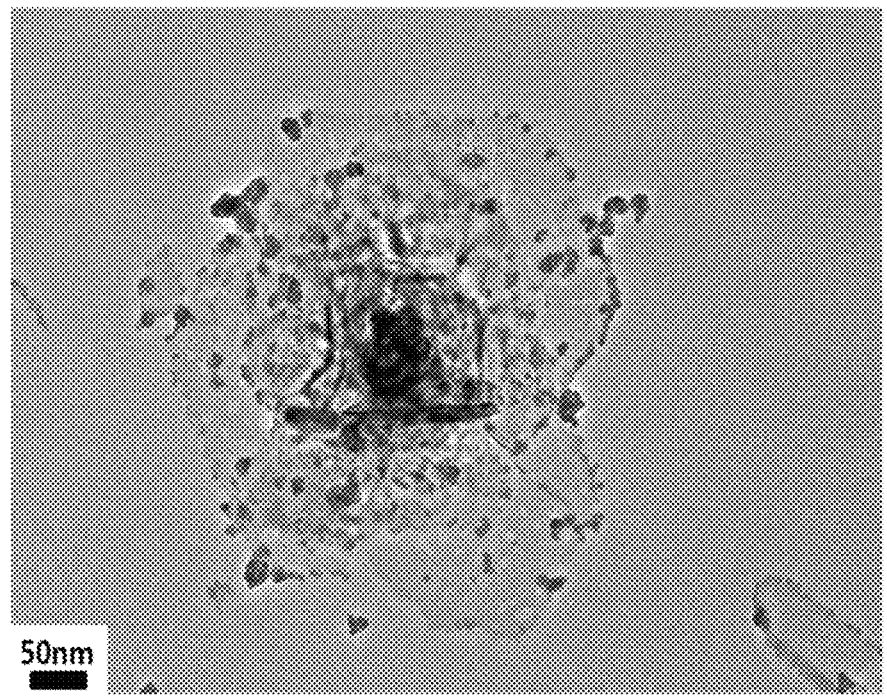
FIG. 2B is an enlarged view of FIG. 2A.

In the obtained nanocomposite, as can be seen from FIG. 2A and FIG. 2B, the metal nanoparticle is dispersed on the surface of the $Bi_2Te_{3-x}Se_x$ ($0 \leq x \leq 3$) nanoplatelet.

Yet another aspect provides a nanocomposite-type thermoelectric material including the nanocomposite.

According to one embodiment, a nanocomposite-type thermoelectric material may be obtained by pressure sintering (e.g., spark plasma sintering) the prepared nanocomposite.

Specifically, the nanocomposite-type thermoelectric material maintains a composite-type nanostructure when pressure sintered, that is, a nanostructure wherein metal nanoparticle is disposed on the surface of the nanoplatelet, even when processed in bulk, is provided.

The thermoelectric material maintaining the composite-type nanostructure even in bulk form may provide a decreased thermal conductivity because phonons are scattered by the high density of grain boundaries provided by the nanoplatelet, and simultaneously, a large decrease in thermal conductivity may occur because the phonon scattering effect is increased, e.g., doubled, by the metal nanoparticle.

Furthermore, the Seebeck coefficient may be increased by a carrier filtering effect by the conductive metal nanoparticle, thus synergistically improving the ZT (figure of merit).

Yet another embodiment provides a method of producing the nanocomposite-type thermoelectric material.

According to an embodiment, the method of producing the nanocomposite-type thermoelectric material may include disposing the nanocomposite prepared as disclosed above into a mold, specifically a mold made of a graphite material, and pressure sintering the nanocomposite under vacuum for a selected time.

Specifically, the pressure sintering may include spark plasma sintering, and more specifically pressure sintering at a pressure of about 10 to about 100 megaPascals (MPa), specifically about 20 to about 80 MPa, and a temperature of about 100 to about 400° C., specifically about 200 to about 300° C., more specifically about 225 to about 275° C.

At a temperature of greater than or equal to about 300° C., nanoparticles may abnormally grow, and thus the nanostructure may not be maintained.

Figure 3:
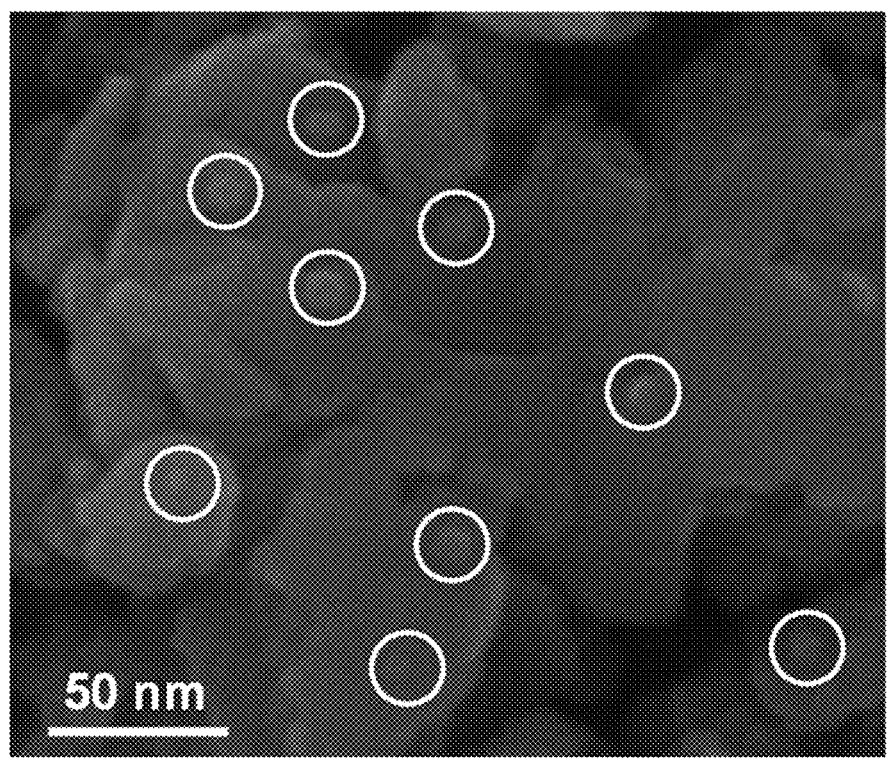
FIG. 3 shows a scanning electron microscope (SEM) image of a bulk thermoelectric material produced from a composite including a Pt nanoparticle bonded to a $Bi_2Te_3$ nanoplatelet and having a size of 5 to 10 nm as prepared in Example 1 and having been treated with spark plasma sintering.

By the disclosed method, a nanocomposite-type thermoelectric material having a composite-type nanostructure wherein the metal nanoparticle is disposed on the surface of the nanoplatelet even when in a bulk form may be obtained, as is shown in FIG. 3, for example.

The following examples illustrate the present disclosure in more detail.

These examples, however, should not in any sense be interpreted as limiting the scope of the present disclosure.

EXAMPLES

Preparation Example 1

Preparation of $Bi_2Te_3$ Nanoplatelet

A solution of 1 gram g of polyvinyl pyrrolidone (PVP) in 40 milliliters (ml) of ethylene glycol and a solution of 0.45 g of polyethyleneimine (PEI) in 40 ml of ethylene glycol are mixed in a 250 ml round-bottomed flask.

A thermoelectric material nanoplatelet precursor is mixed with the mixed solution.

As the thermoelectric material nanoplatelet precursor, a solution of 0.242 g of $Na_2TeO_3$ in 35 ml of ethylene glycol and a solution of 0.452 g of $Bi(NO_3)_3.5H_2O$ in 25 ml of ethylene glycol are used.

The mixed solution is agitated at room temperature using magnetic stirring.

The temperature of the flask is raised to 180° C. while maintaining a nitrogen atmosphere.

The transparent solution turns white and finally light yellow, and the reaction is completed.

2.4 ml of $NH_2OH$ functioning as a reducing agent is mixed with 20 ml of ethylene glycol and implanted into the flask, and then the mixture turns dark purple and $Bi_2Te_3$ nanoplatelet is precipitated.

After about 10 minutes, the precipitation reaction is completed, and then the nanoplatelet is cooled to room temperature.

While centrifuging at 12,000 revolutions per minute (rpm) for 10 minutes, the nanoplatelets are washed with a mixed solution of 300 ml of acetone and 60 ml of water to obtain the $Bi_2Te_3$ nanoplatelet.

Figure 1B:
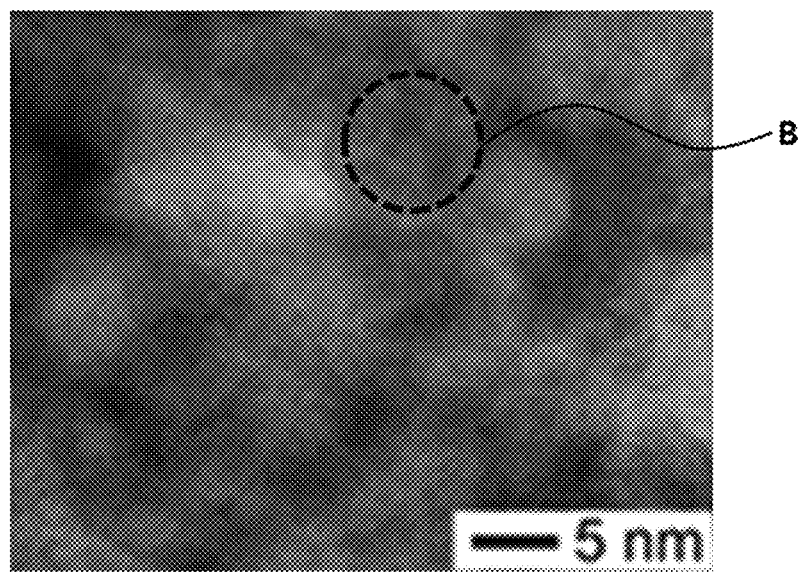
Figure 1C:
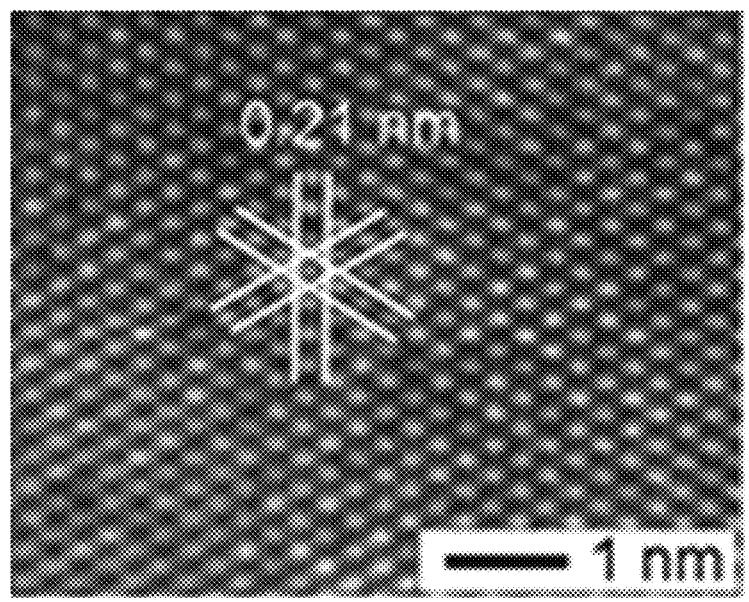
Figure 1D:
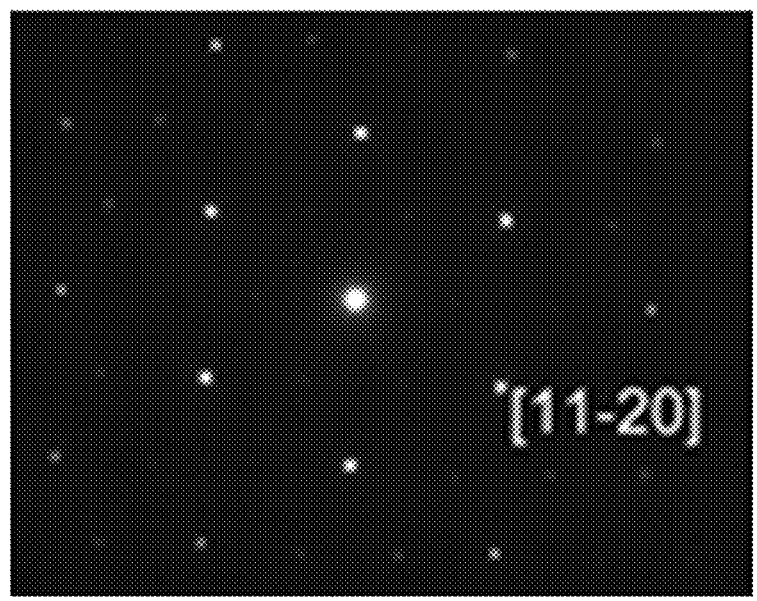

FIGS. 1A to 1D shows the results of TEM analysis of the $Bi_2Te_3$ nanoplatelet in which FIGS. 1A and 1C are bright field images and FIG. 1D is a selected area diffraction image. FIG. 1B is an enlarged view of region A in FIG. 1A, and FIG. 1C is an enlarged view of region B is FIG. 1B.

The nanoplatelet has a thickness of 4 to 6 nm, corresponding to about 4 to about 6 molecule layers, and a largest diameter of 200 to 500 nm.

Preparation Example 2

Preparation of $Bi_2Se_3$ Nanoplatelet

A nanoplatelet of the chemical formula $Bi_2Se_3$ is prepared by the same method as Preparation Example 1, except for using 0.242 g of $Na_2SeO_3$ instead of $Na_2TeO_3$.

Figure 1E:
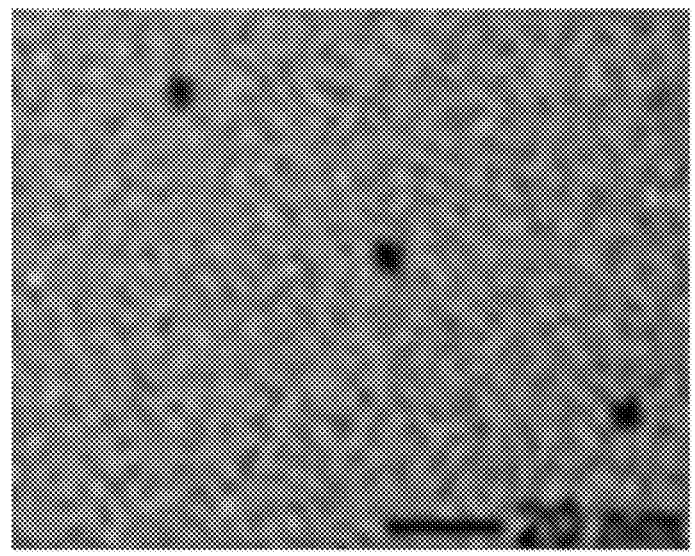
FIGS. 1E to 1H show the results of TEM analysis of a $Bi_2Se_3$ nanoplatelet prepared in Example 2.
Figure 1F:
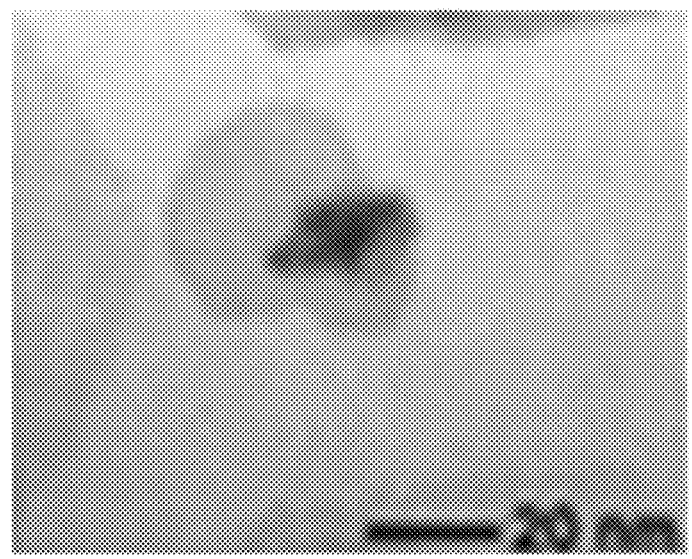
Figure 1G:
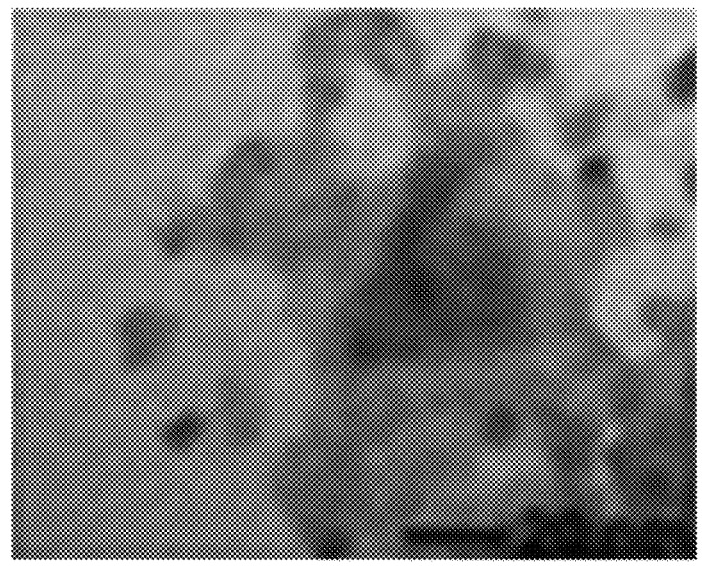
Figure 1H:
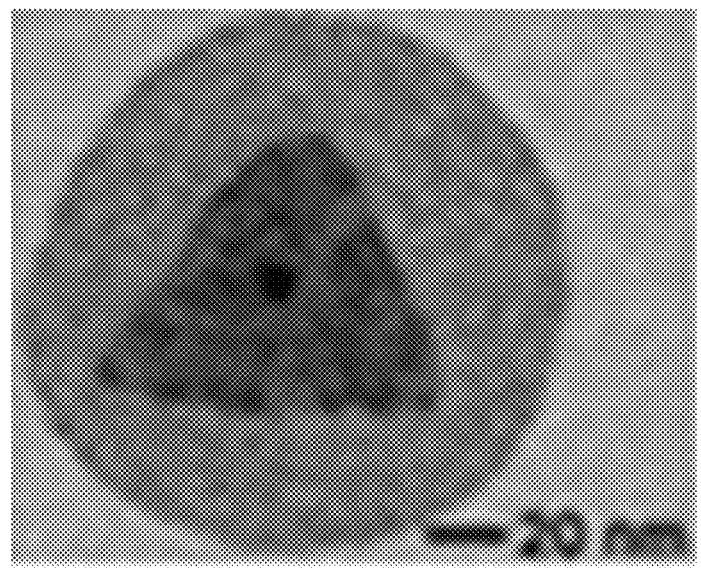
Figure 1I:
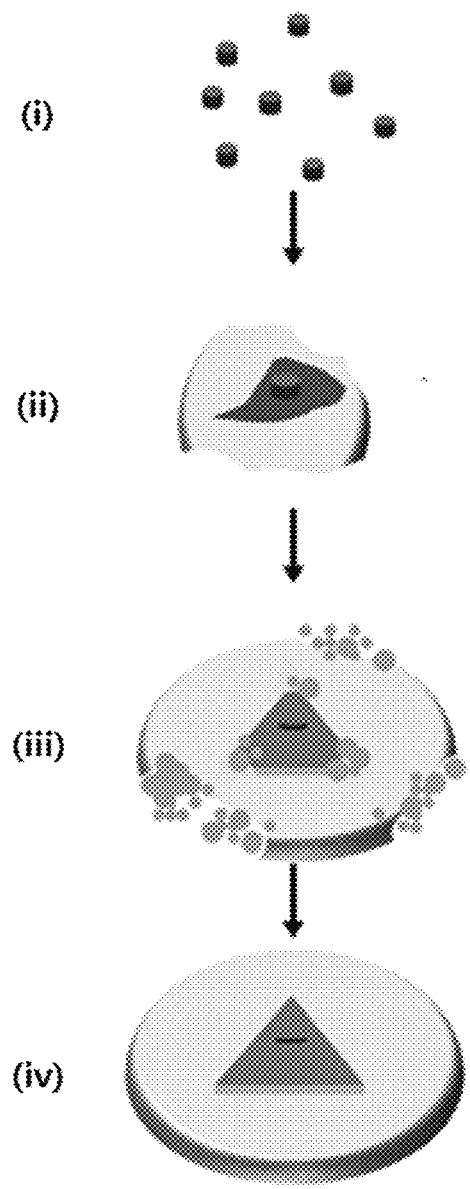
FIG. 1I shows a process of forming a nanocomposite.

FIGS. 1E to 1H show the results of TEM analysis of the obtained $Bi_2Se_3$. Specifically, FIG. 1E shows a metal nanoparticle, and FIG. 1F shows a metal nanoparticle on a nanoplatelet. FIG. I is a schematic diagram of a process of forming the nanocomposite, in which step (i) corresponds to FIG. 1E, step (ii) corresponds to FIG. 1F, step (iii) corresponds to FIG. 1G, and step (iv) corresponds to FIG. 1H.

The nanoplatelet has a thickness of 4 to 6 nm, corresponding to about 4 to about 6 molecule layers, and a largest diameter of 200 to 500 nm.

Example 1

Preparation of a $Bi_2Te_3$ Nanoplatelet Pt Nanoparticle Composite

A composite of the $Bi_2Te_3$ nanoplatelet and a Pt metal nanoparticle is prepared as follows.

First, during the synthesis of the $Bi_2Te_3$ nanoplatelet as described in Preparation Example 1, 1 hour after introducing a reducing agent ($NH_2OH$), a solution of $Na_2PtCl_4$ as a Pt precursor in 20 ml of ethylene glycol is mixed with the nanoplatelet synthesis solution.

Then, during the process of precipitation of the $Bi_2Te_3$ nanoplatelet, a composite of a Pt nanoparticle bonded to the surface of the nanoplatelet is formed.

Subsequently, the composite is washed with a mixed solution of 300 ml of acetone and 60 ml of water while centrifuging at 12,000 rpm for 10 minutes to prepare a $Bi_2Te_3$ nanoplatelet-Pt nanoparticle composite.

FIG. 2A and FIG. 2B show TEM images of a nanocomposite wherein a Pt nanoparticle is bonded to the surface of $Bi_2Te_3$ nanoplatelet and has a size of 5 to 10 nm.

As shown in FIG. 2A and FIG. 2B, a structure wherein the Pt nanoparticle is uniformly dispersed on the $Bi_2Te_3$ nanoplatelets is formed, and the nanostructure is maintained even in the case that it is processed to provide a bulk material by spark plasma sintering as in Example 5. The spark plasma sintered product is shown in FIG. 3.

Example 2

Preparation of $Bi_2Te_3$ Nanoplatelet-Pd Nanoparticle Composite

A $Bi_2Te_3$ nanoplatelet-Pd nanoparticle composite is prepared by the same method as Example 1, except for using the Pd precursor $Na_2PdCl_4$ instead of Pt for metal nanoparticle.

Example 3

Preparation of $Bi_2Te_3$ Nanoplatelet-Au Nanoparticle Composite

A $Bi_2Te_3$ nanoplatelet-Au nanoparticle composite is prepared by the same method as Example 1, except for using the Au precursor $Na_2AuCl_4$ instead of Pt for metal nanoparticle.

Example 4

Preparation of $Bi_2Te_3$ Nanoplatelet-Ag Nanoparticle Composite

A $Bi_2Te_3$ nanoplatelet-Ag nanoparticle composite is prepared by the same method as Example 1, except for using the Ag precursor $Na_2AgCl_2$ instead of Pt for metal nanoparticle.

Example 5

Preparation of $Bi_2Se_3$ Nanoplatelet-Pt Nanoparticle Composite

A composite of a $Bi_2Se_3$ nanoplatelet instead of the $Bi_2Te_3$ nanoplatelet and the metal nanoparticle is prepared as follows.

First, during the synthesis of the $Bi_2Se_3$ nanoplatelet as described in Preparation Example 2, 1 hour after introducing a reducing agent ($NH_2OH$), a solution of $Na_2PtCl_4$ as a Pt precursor in 20 ml of ethylene glycol is mixed with the nanoplatelet synthesis solution.

Then, during the process of precipitation of the $Bi_2Se_3$ nanoplatelet, a nanocomposite of Pt nanoparticle bonded to the surface of the nanoplatelet is formed.

Subsequently, the nanocomposite is washed with a mixed solution of 300 ml of acetone and 60 ml of water while centrifuging at 12,000 rpm for 10 minutes to finally prepare a $Bi_2Se_3$ nanoplatelet-Pt nanoparticle composite.

Example 6

Preparation of $Bi_2Se_3$ Nanoplatelet-Pd Nanoparticle Composite

A $Bi_2Se_3$ nanoplatelet-Pd nanoparticle composite is prepared by the same method as Example 5, except for using the Pd precursor $Na_2PdCl_4$ instead of Pt for metal nanoparticle.

Example 7

Preparation of $Bi_2Se_3$ Nanoplatelet-Au Nanoparticle Composite

A $Bi_2Se_3$ nanoplatelet-Au nanoparticle composite is prepared by the same method as Example 5, except for using the Au precursor $Na_2AuCl_4$ instead of Pt for metal nanoparticle.

Example 8

Preparation of $Bi_2Se_3$ Nanoplatelet-Ag Nanoparticle Composite

A $Bi_2Se_3$ nanoplatelet-Ag nanoparticle composite is prepared by the same method as Example 5, except for using the Ag precursor $Na_2AgCl_2$ instead of Pt for metal nanoparticle.

Example 9

$Bi_2Te_3/Bi_2Se_3$ Nanoplatelet-Pt/Pd/Au/Ag Nanoparticle Composite-Type Thermoelectric Material The $Bi_2Te_3$ nanoplatelet-Pt nanoparticle composite, $Bi_2Te_3$ nanoplatelet-Pd nanoparticle composite, $Bi_2Te_3$ nanoplatelet-Au nanoparticle composite, $Bi_2Te_3$ nanoplatelet-Ag nanoparticle composite, $Bi_2Se_3$ nanoplatelet-Pt nanoparticle composite, $Bi_2Se_3$ nanoplatelet-Pd nanoparticle composite, $Bi_2Se_3$ nanoplatelet-Au nanoparticle composite, and $Bi_2Se_3$ nanoplatelet-Ag nanoparticle composite prepared in Examples 1 to 8 are respectively introduced into a graphite mold, spark plasma sintered in a vacuum (at less than or equal to $10^{-2}$ Torr) at a temperature of 250° C. and at a pressure of 50 MPa, to prepare a bulk thermoelectric material of each composition.

FIG. 3 shows a SEM image of the bulk thermoelectric material prepared from the composite of Pt nanoparticle bonded to the $Bi_2Te_3$ nanoplatelets with a 5-10 nm size.

Preparation Example 3

Preparation of $Bi_2Te_3/Bi_2Se_3$ Nanoplatelet Thermoelectric Material

The nanoplatelet prepared in Preparation Example 1 and Preparation Example 2 are respectively introduced into a graphite mold, and spark plasma sintered in a vacuum (at less than or equal to $10^{-2}$ Torr) at a temperature of 250° C. and at a pressure of 50 MPa, to prepare each bulk thermoelectric material, as described in Example 9.

Experimental Example

Evaluation of Figure of Merit

For the thermoelectric material consisting of the $Bi_2Te_3$ nanoplatelet prepared in Preparation Example 3, and the thermoelectric materials prepared from the nanocomposites of Examples 1 to 4, prepared in Example 9, the results of figure of merit analysis, including electrical conductivity, Seebeck coefficient, power factor, thermal conductivity, lattice thermal conductivity, and figure of merit (ZT) are shown in FIG. 4A to FIG. 4F.

Electrical conductivity is measured by the DC 4-probe method at 300-440 K, and the Seebeck coefficient is measured by a steady-state method.

The power factor is $S^2\sigma$ as described in the above Equation 1, and is calculated by multiplying electrical conductivity by the square of the Seebeck coefficient.

Thermal conductivity is calculated using heat capacity measured by a thermal relaxation method, thermal diffusivity measured by a laser-flash method in a vacuum, and bulk density of a thermoelectric device.

Lattice thermal conductivity may be obtained by subtracting the thermal conductivity contribution part of electrons, which is calculated by substituting the measured electrical conductivity and Seebeck coefficient using the Wiedemann-Franz law, from the entire thermal conductivity.

Figure 4A:
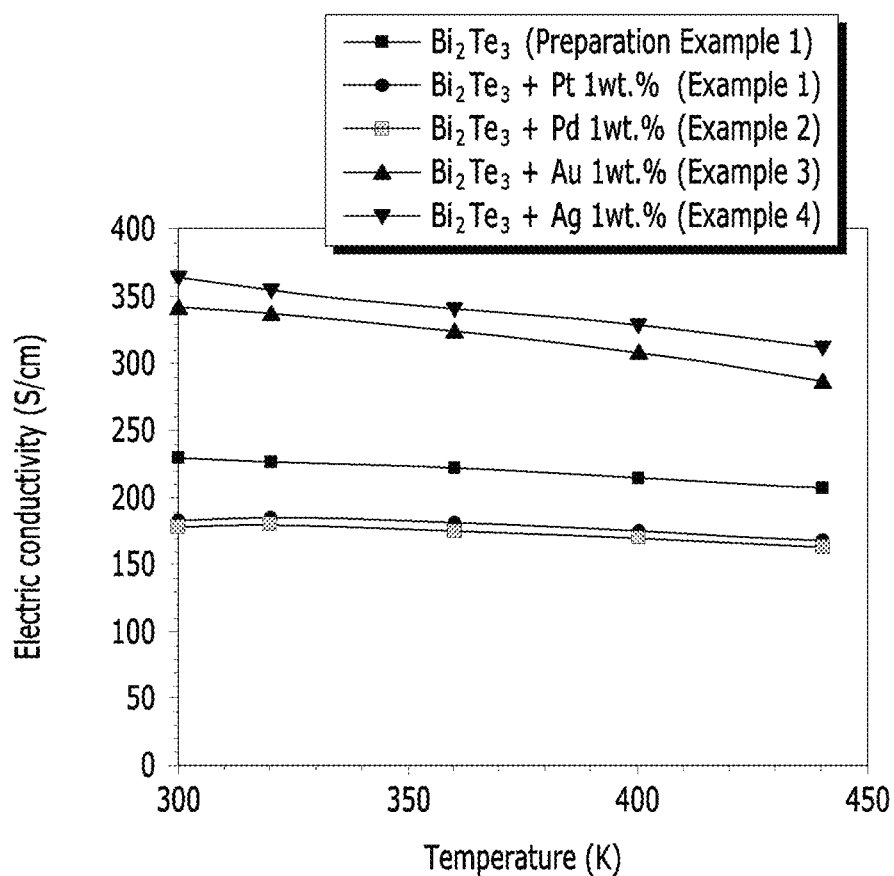
FIG. 4A to FIG. 4F are graphs for evaluating figure of merit, respectively showing electrical conductivity (Siemens per centimeter, S/cm), Seebeck coefficient (microvolts per Kelvin, µV/K), power factor (Watts per centimeter-square Kelvin, $W/cmK^2$), thermal conductivity (Watts per meter-Kelvin, W/mK), lattice thermal conductivity (Watts per meter-Kelvin, W/mK), and figure of merit (ZT), each versus temperature (Kelvin, K) of the $Bi_2Te_3$ nanoplatelet prepared in Preparation Example 1 and sintered in Preparation Example 3, and the thermoelectric materials prepared from the nanocomposites of Examples 1 to 4 and sintered in Example 9.

As can be seen from FIG. 4A, compared to the $Bi_2Te_3$ nanoplatelet thermoelectric material, the electrical conductivity of the $Bi_2Te_3$ nanoplatelet-Pt or -Pd nanoparticle (1 wt %) composite thermoelectric material decreases about 20% in the entire temperature range (300-440K), and the electrical conductivity of the $Bi_2Te_3$ nanoplatelet-Au or -Ag nanoparticle (1 wt %) composite thermoelectric material increases about 50% in the entire temperature range (300-440K).

Figure 4B:
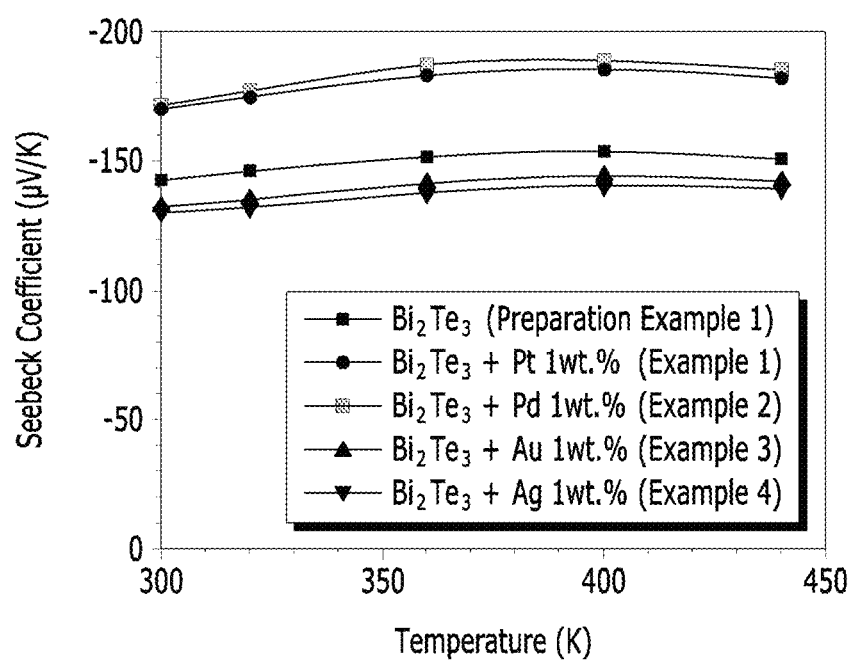

Further, as can be seen from FIG. 4B, the Seebeck coefficient of the $Bi_2Te_3$ nanoplatelet-Pt or -Pd nanoparticle (1 wt %) composite thermoelectric material increases about 20% compared to the $Bi_2Te_3$ nanoplatelet thermoelectric material, and the Seebeck coefficient of the $Bi_2Te_3$ nanoplatelet-Au or -Ag nanoparticle (1 wt %) composite thermoelectric material decreases about 10% compared to the $Bi_2Te_3$ nanoplatelet thermoelectric material.

The change in electrical conductivity results from a charge density decrease (in the case of Pt or Pd) or a charge density increase (in the case of Au or Ag) due to the introduction of Pt, Pd, Au, or Ag.

Figure 4C:
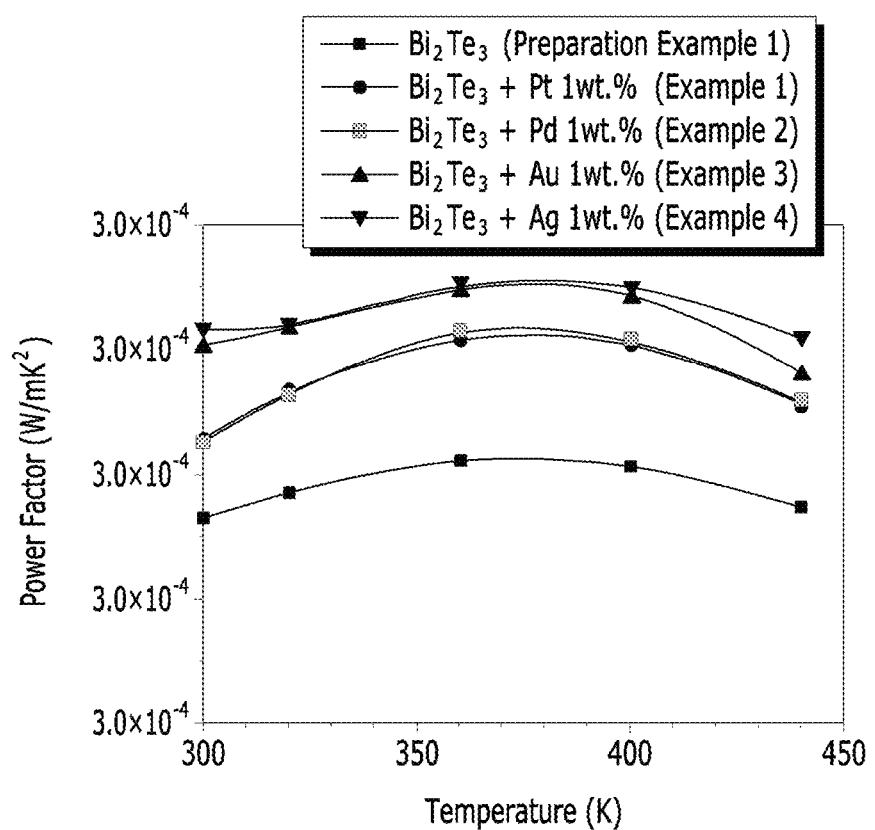

As can be seen from FIG. 4C, in the case of a Pt or Pd composite, electrical conductivity is decreased from a decrease in charge density, and the Seebeck coefficient increases to the same level compared to the electrical conductivity decrease, and thus the power factor of the $Bi_2Te_3$ nanoplatelet-Pt or -Pd nanoparticle (1 wt %) composite thermoelectric material increases about 15% compared to the $Bi_2Te_3$ nanoplatelet thermoelectric material.

Figure 4D:
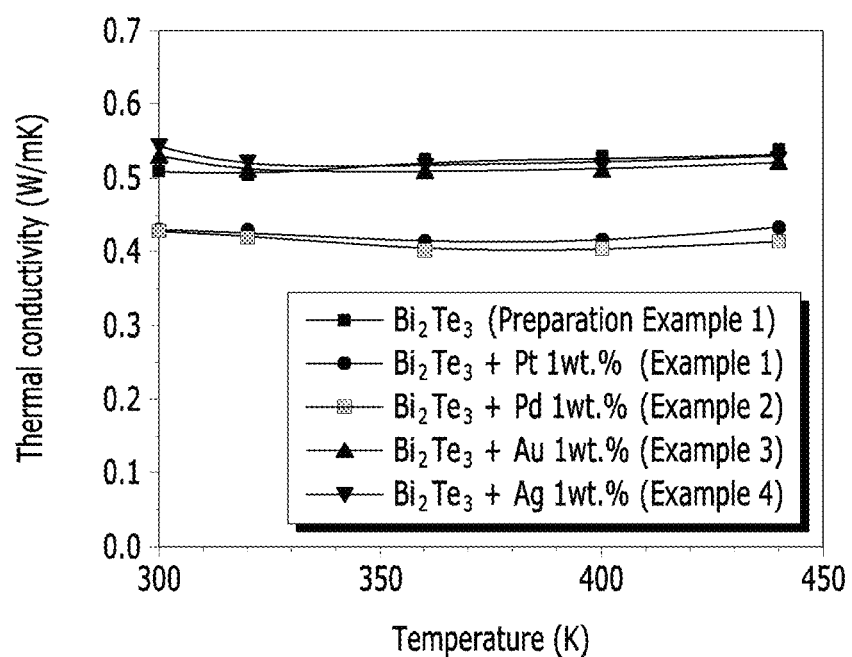

As shown in FIG. 4D, in the case of an Au or Ag composite, electrical conductivity increases from an increase in charge density, and the Seebeck coefficient decreases, but the electrical conductivity largely increases as compared to the Seebeck coefficient decrease, and thus the power factor of the $Bi_2Te_3$ nanoplatelet-Au or -Ag nanoparticle (1 wt %) composite thermoelectric material increases about 20% compared to the $Bi_2Te_3$ nanoplatelet thermoelectric material.

While not wanting to be bound by theory, it is understood that this is due to a carrier filtering effect by the Pt, Pd, Au, or Ag nanoparticles.

Figure 4E:
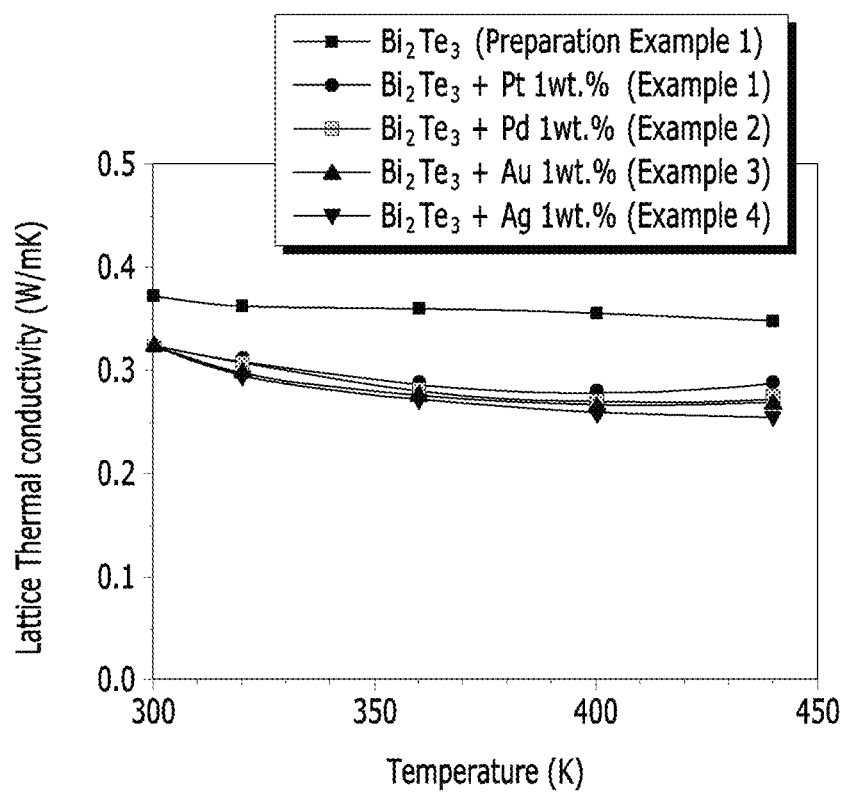

As shown in FIG. 4E, lattice thermal conductivity decreases about 10% by the introduction of the Pt, Pd, Au, or Ag nanoparticles.

While not wanting to be bound by theory, it is understood that this is because a phonon glass electron crystal (PG EC) is provided by phonon scattering by the metal nanoparticle.

Figure 4F:
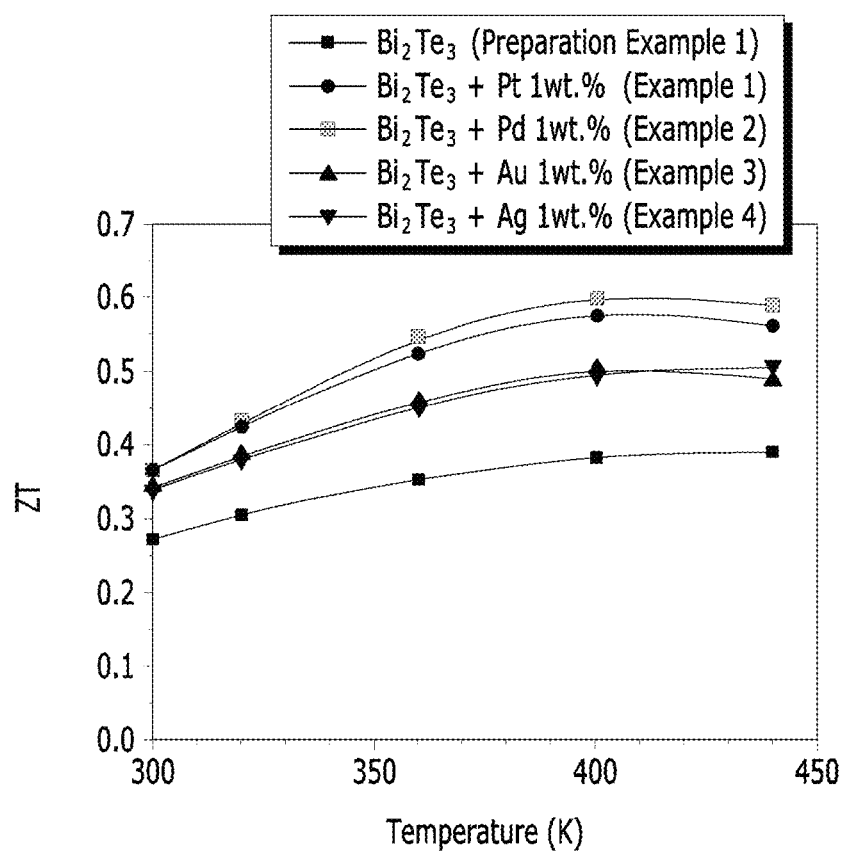

As shown in FIG. 4F, a figure of merit (ZT) of the $Bi_2Te_3$ nanoplatelet-Pt or -Pd nanoparticle composite thermoelectric material increases about 25% in the entire measurement temperature range compared to the $Bi_2Te_3$ nanoplatelet thermoelectric material, and the figure of merit (ZT) of the $Bi_2Te_3$ nanoplatelet-Au or -Ag nanoparticle composite thermoelectric material increases about 15% in the entire measurement temperature range compared to the $Bi_2Te_3$ nanoplatelet thermoelectric material.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A nanocomposite comprising:
   a thermoelectric material nanoplatelet having a ratio of a largest diameter to a thickness of about 33 to about 125; and
   a metal nanoparticle disposed on a surface of the thermoelectric material nanoplatelet, wherein the metal nanoparticle comprises a metal selected from Pt, Pd, and Au.

2. The nanocomposite of claim 1, wherein the thermoelectric material nanoplatelet has a chemical formula of $Bi_2Te_{3-x}Se_x$ wherein $0 \leq x \leq 3$.

3. The nanocomposite of claim 2, wherein the thermoelectric material nanoplatelet is selected from $Bi_2Te_3$, $Bi_2Se_3$, and a combination of $Bi_2Te_3$ and $Bi_2Se_3$.

4. The nanocomposite of claim 2, wherein the nanoplatelet has a thickness of about 4 to about 6 nanometers and a largest diameter of about 200 to about 500 nanometers.

5. The nanocomposite of claim 2, consisting of the thermoelectric material nanoplatelet and the metal nanoparticle.

6. The nanocomposite of claim 1, wherein the metal nanoparticle is present in an amount of about 0.1 to about 10 parts by weight, based on 100 parts by weight of the thermoelectric material nanoplatelet.

7. The nanocomposite of claim 1, wherein the metal nanoparticle has a particle diameter of less than or equal to about 50 nanometers.

8. A bulk thermoelectric material comprising the nanocomposite of claim 1.

9. The thermoelectric material of claim 8, wherein the thermoelectric material comprises a metal nanoparticle disposed on a surface of the thermoelectric material nanoplatelet after treatment with spark plasma sintering.

\* \* \* \* \*